United States Patent [19]

Kuo et al.

[11] Patent Number: 5,606,521

[45] Date of Patent: Feb. 25, 1997

[54] ELECTRICALLY ERASABLE AND PROGRAMMABLE READ ONLY MEMORY WITH NON-UNIFORM DIELECTRIC THICKNESS

[75] Inventors: Di-Son Kuo, Ardsley; Len-Yuan Tsou, New City; Satyendranath Mukherjee, Yorktown; Mark Simpson, Ossining, all of N.Y.

[73] Assignee: Philips Electronics North America Corp., New York, N.Y.

[21] Appl. No.: 496,104

[22] Filed: Jun. 28, 1995

[51] Int. Cl.$^6$ ............................ G11C 11/00; G11C 11/34; H01L 29/788

[52] U.S. Cl. .................... 365/149; 365/185.26; 257/314; 257/315

[58] Field of Search ............................... 365/149, 185.26; 257/314, 315, 316

[56] References Cited

U.S. PATENT DOCUMENTS 4,990,979  2/1991  Otto .................................... 257/397
5,017,977  5/1991  Richardson ........................... 257/316
5,146,426  9/1992  Mukherjee et al. ..................... 365/149
5,386,132  1/1995  Wong .................................. 257/316

FOREIGN PATENT DOCUMENTS 181368   3/1989  Japan .
3280580  12/1991  Japan .

Primary Examiner—David C. Nelms
Assistant Examiner—Trong Phan
Attorney, Agent, or Firm—Steven R. Biren

[57] ABSTRACT

An electrically erasable and programmable read only memory (EEPROM) is provided with an insulated control gate and an insulating floating gate in a trench in a semiconductor body. A dielectric layer is disposed along the sidewalls of the trench to separate the floating gate and the semiconductor body. The thickness of the dielectric layer along at least one sidewall of the trench is greater than the thickness of the dielectric layer along the other sidewalls of the trench in order to increase the programming speed due to a higher electric field in the gate oxide along the remaining sidewalls.

10 Claims, 2 Drawing Sheets

5,606,521

ELECTRICALLY ERASABLE AND PROGRAMMABLE READ ONLY MEMORY WITH NON-UNIFORM DIELECTRIC THICKNESS

BACKGROUND OF THE INVENTION

This invention relates to a read only memory device (ROM), and in particularly to an electrically erasable and programmable read only memory (EEPROM) device having a more compact size and higher programming speed than a conventional EEPROM device.

EEPROM devices, in general, and methods for making such devices, are well known in the art. Typically, an EEPROM device structure has a floating gate and a control gate, both of which are typically fabricated out of polycrystalline silicon doped with an appropriate doping material to render the polycrystalline conductive. A typical doping material is phosphorous.

The floating gate is separated from a substrate region by a gate dielectric layer of insulating material such as silicon dioxide, while the substrate region includes source and drain regions with a channel region therebetween. The floating gate and the control gate are separated by an intergate dielectric, typically silicon dioxide. The basic principle upon which the EEPROM device operates is as follows: the charge is stored on the floating gate in a capacitive manner and can be subsequently electrically erased as described in U.S. Pat. No. 5,146,426 herein incorporated by reference.

There are many different trench-based EEPROM device structures, such as the one described in Japanese Patent No. 3-280580, which shows a memory cell consisting of two transistors in series. One side of the trench is a stacked-gate MOSFET. The other side of the trench is a single gate MOSFET. The gate structures are separated from each other at the bottom of the trench.

Japanese Patent No. 1-81368 shows an EEPROM device where the channel region is on the top surface of the substrate and only the tunnel oxide and first polysilicon layer extending into the trench. The inter-poly layer and second polysilicon layer are disposed outside the trench.

Another embodiment is shown in U.S. Pat. No. 4,990,979 which shows a trench-based EEPROM device wherein two memory cells share a single trench. In addition, the channel region is on the top surface of the substrate and the gate oxide and tunnel oxide layers are separately formed.

In order to overcome the disadvantages of earlier trench-based EEPROM devices, a compact EEPROM device, such as the one described in U.S. Pat. No. 5,146,426, includes an insulated control gate and an insulated floating gate formed in a trench within a semiconductor body. A surface-adjoining drain region is provided alongside an upper portion of a sidewall of the trench, while a source region is provided alongside the lower portion of the sidewall of the trench, with a channel region extending along the sidewall of the trench between the source and drain regions. The device is programmed through the trench sidewall portion which is adjacent the channel region, and is erased through a corner region in the bottom of the trench by causing a localized high electric field density in the corner region during the erase operation.

As the use of EEPROM devices continues to grow, it is important that the programming speed be increased beyond that of a conventional EEPROM device. None of these EEPROM devices offers a significantly high programming speed while maintaining the trench-based configuration.

SUMMARY OF THE INVENTION

It is therefore an object of the invention to provide an EEPROM device in which the programming and reading functions are performed at a higher speed than in prior art EEPROM devices.

It is a further object of the invention to provide an EEPROM device in which programming and erasing functions are efficiently incorporated into a vertical, single-cell structure having a compact size.

In accordance with the invention, these objects are achieved by a unique EEPROM device configuration which combines the features of compactness, low-operating voltage, high endurance and fast programming speed in a single-cell vertical EEPROM device.

The basic structure of an EEPROM device in accordance with the invention includes an insulated control gate and an insulated floating gate formed in a trench within a semiconductor body. A dielectric layer is disposed along the sidewalls of the trench to separate the floating gate and the semiconductor body. The thickness of the dielectric is made non-uniform along at least one of the sidewalls. Therefore, the potential of the first polysilicon layer can be more effectively raised through the applied voltage of the second polysilicon layer than in a device having a uniformly thin dielectric layer on all sidewalls.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a further understanding of the invention, reference is provided to the following description taken in connection with the accompanying drawings, in which.

DETAILED DESCRIPTION OF THE PREFERRED EMBODIMENTS

Figure 1:
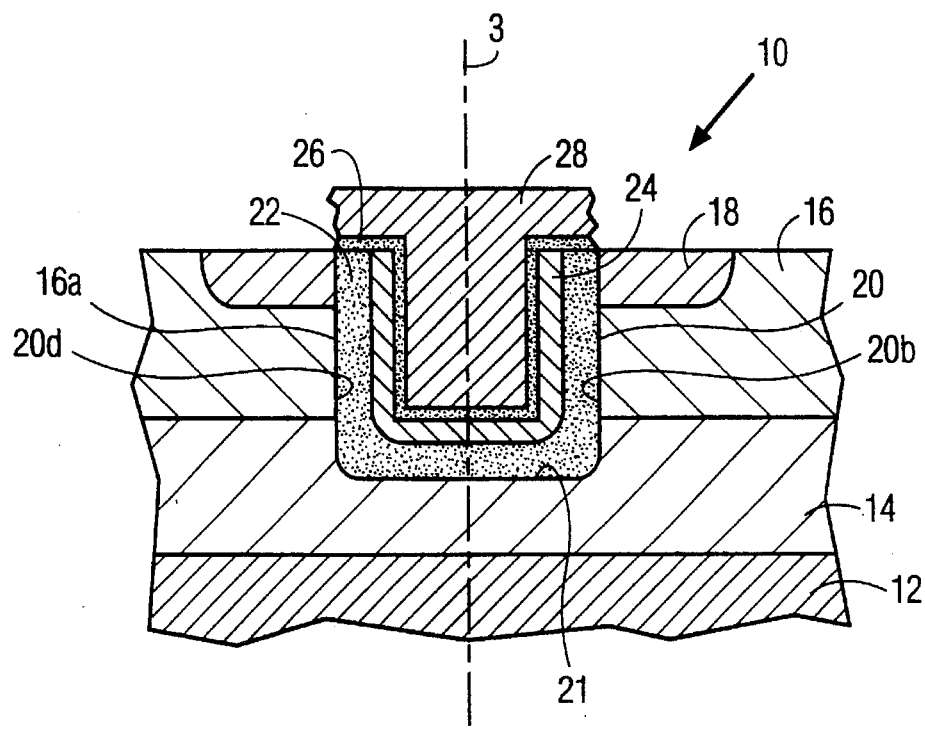
FIG. 1 is a cross-sectional view showing sidewalls 20b and 20d of an EEPROM device in accordance with a first embodiment of the invention.
Figure 2:
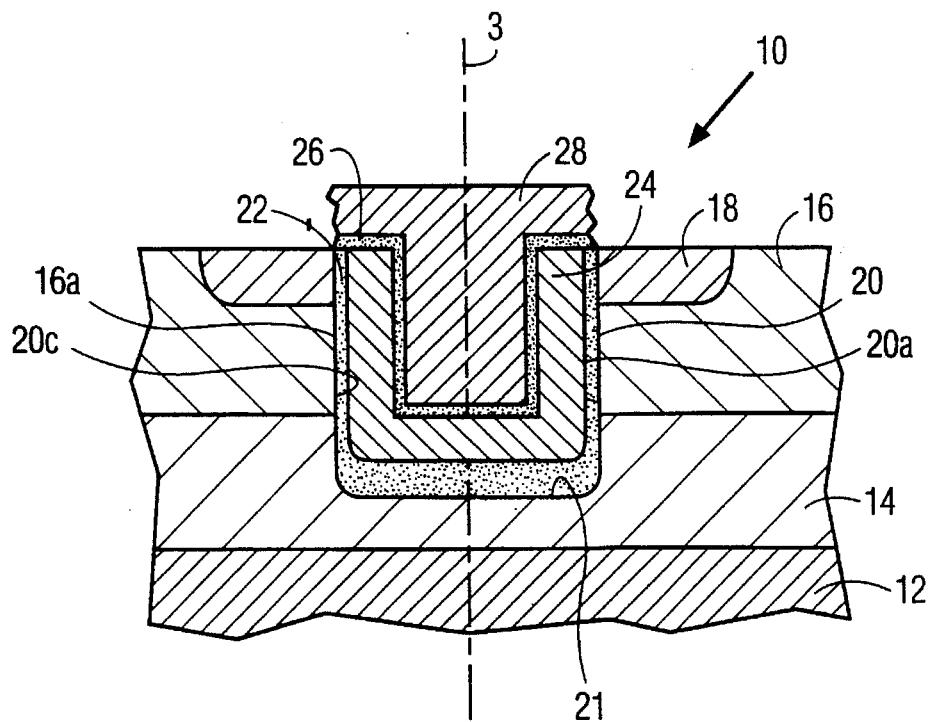
FIG. 2 is another cross-sectional view showing sidewalls 20a and 20c of the EEPROM device in accordance with the first embodiment of the invention.
Figure 3:
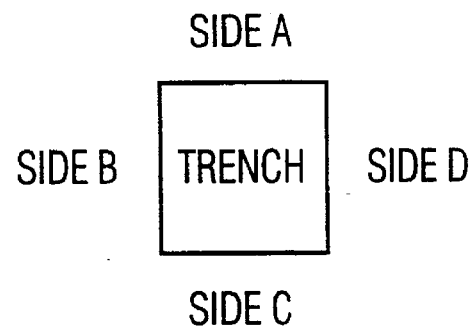
FIG. 3 is a plan view of an EEPROM device in accordance with the first embodiment of the invention.

FIGS. 1, 2 and 3 show a single transistor trench based electrically erasable and programmable read only memory (EEPROM) cell 10 in accordance with a first embodiment of the invention. Cell 10 is formed in a semiconductor body having a first semiconductor layer 12 of a first conductivity type (in this example n-type) and a doping level of about $10^{19}$ at/cm$^3$ or higher. Semiconductor layer 12 can also be of a p-type having a doping level of $10^{18}$ at/cm$^3$ or below. Cell 10 also includes a second semiconductor layer 14 of a first conductivity type (in this example n-type) on the first layer and having a lower doping level of about $10^{18}$ at/cm$^3$ and a thickness of about 0.5 u. The first and second layers form the source region of the EEPROM cell. A third semiconductor layer 16 having a second conductivity type (here p-type) is provided on second layer 14 and extends to the surface of cell 10. The thickness of this layer is about 0.6–1.0 u and its doping level is about $5\times10^{17}$ at/cm$^3$. A fourth surface-adjoining, highly-doped semiconductor layer 18 of a first conductivity type (in this example, n-type) is provided locally in the third layer and forms a drain region of cell 10. Fourth layer 18 has a doping level of about $10^{20}$ at/cm$^3$ and a thickness of about 0.1–0.4 u.

A trench 20 having a floor 21 and sidewall portions 20a, 20b, 20c and 20d extends through third layer 16 and fourth layer 18 and partly into second layer 14. In this embodiment, trench 20 has a substantially square configuration, however the shape of trench 20 is not limited to that shown in FIGS. 1 and 2 and can have a rectangular, circular or other shape. A channel region 16a is located in a portion of third layer 16 adjacent sidewall portions 20a, 20b, 20c and 20d and extending in a substantially vertical direction from the source region to the drain region of the device. Sidewall portions 20a, 20b, 20c and 20d and floor 21 are covered with a gate dielectric 22 formed of an insulating material such as silicon dioxide.

Specific reference is now provided to FIGS. 1 and 2 which show an EEPROM device in accordance with a first embodiment of the invention. Reference numerals mentioned above with respect to FIG. 1 refer to the same elements in the following figures. The thickness of gate dielectric 22 of sidewall portions 20a and 20c is about 100 A while the thickness of gate dielectric 22 on sidewall portions 20b and 20d is substantially thicker, for example, about 1000 A. A floating gate 24 is formed of polysilicon and is provided on gate dielectric 22 and extends to adjacent sidewall portions 20a, 20b, 20c and 20d and floor 21. The interior portions of floating gate 24 are covered by an intergate dielectric 26 formed of a layer of silicon dioxide or silicon dioxide and silicon nitride having a thickness of about 200 Angstroms. The structure of cell 10 is completed by a control gate 28 formed of polysilicon on intergate dielectric 26 and extending within trench 20 to about the same depth as third layer 16, with control gate 28 being separated from channel region 16a by floating gate 24, gate dielectric 22 and intergate dielectric 26.

The structural features described above afford several advantages over prior art EEPROM devices. First, by increasing the thickness of gate 22 on sidewall portions 20b and 20d, the potential on floating gate 24 can be more effectively raised through the applied voltage on control gate 28. Consequently, the programming speed is higher due to a higher electric field in the gate oxide on sidewalls 20a and 20c. It would first appear that during a read operation, the current through sidewall portions 20b and 20d would be reduced compared to a conventional EEPROM cell. However, since the potential of floating gate 28 is higher that the potential seen in a conventional EEPROM device, larger channel current is obtained on sidewalls 20a and 20c. The current loss is thus minimized and does not adversely effect the operation of cell 10.

Figure 4:
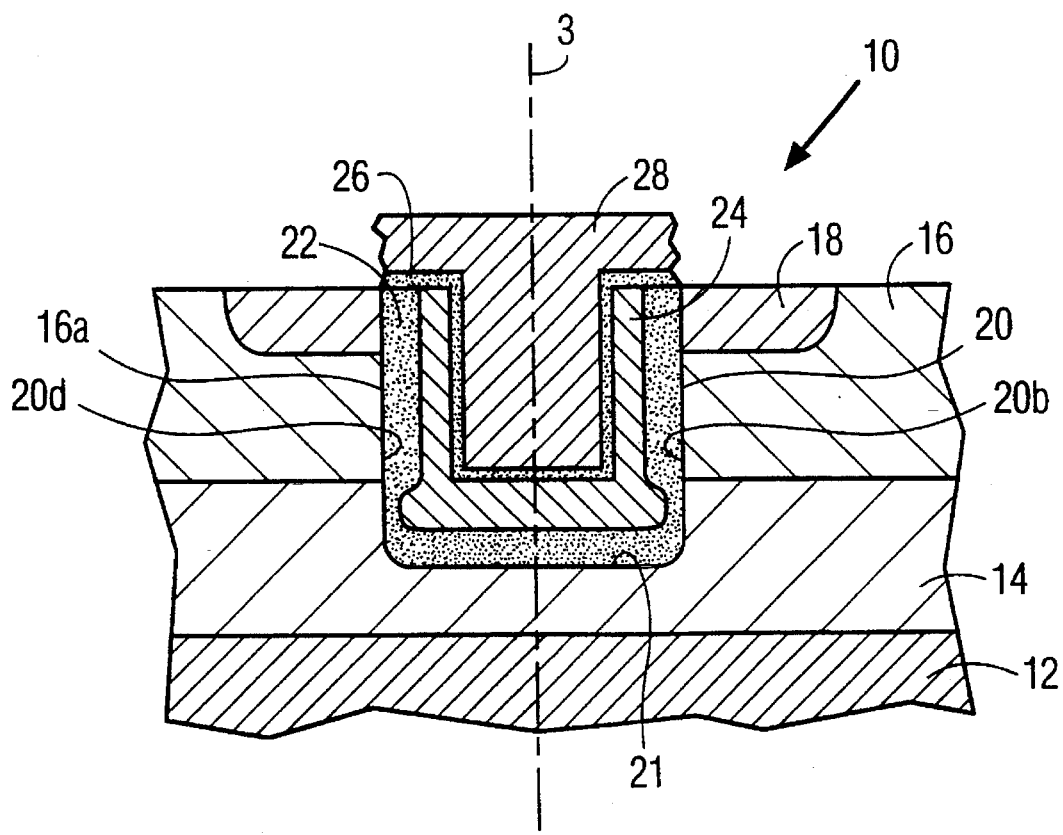
FIG. 4 is a cross-sectional view of an EEPROM device in accordance with a second embodiment of the invention.

Reference is now provided to FIG. 4 which shows an EEPROM cell in accordance with a second embodiment of the present invention. This embodiment differs from the first in that the thickness of dielectric layer 22 over sidewalls 20b and 20d varies across the length of each sidewall from about 1000 A to about 100 A. The thickness of dielectric layer 22 over sidewalls 20a and 20c is the same as shown in FIG. 2 and discussed above with respect to the first embodiment. In this embodiment, dielectric layer 22 is kept relatively thin near the bottom of the trench in order to provide superior electrical erase performance.

It will thus be seen that the objects set forth above among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An electrically erasable and programmable read only memory (EEPROM) cell, comprising:

a first semiconductor layer of a first conductivity type;

a second semiconductor layer of said first conductivity type disposed on said first layer and having a lower doping level than that of said first layer, said first and second layers together forming a source region of said EEPROM cell;

a third semiconductor layer of a second conductivity type opposite that of said first type disposed on said second layer and extending to a surface of said EEPROM cell;

a fourth surface-adjoining semiconductor layer of said first conductivity type provided locally in said third layer and forming a drain region of said EEPROM cell;

a trench extending through said third and fourth layers and partially into said second layer, said trench having a floor and first, second, third and fourth sidewall portions;

a channel region located in a portion of said third layer adjacent a sidewall subportion of said trench and extending from said second region to said fourth region;

a gate dielectric covering each of said sidewalls and said floor of said trench, a portion of said gate dielectric covering a selected sidewall subportion having a thickness different from a thickness of said gate dielectric covering another sidewall subportion;

a floating gate on said gate dielectric and extending adjacent the sidewall and floor of said trench;

an intergate dielectric covering at least an inner sidewall and floor of said floating gate; and a control gate disposed on said intergate dielectric and separated from said channel region by said floating gate.

2. The EEPROM cell of claim 1, wherein the thickness of said gate dielectric covering said second sidewall portion is substantially equal to the thickness of said gate dielectric covering said fourth sidewall portion.

3. The EEPROM cell of claim 1, wherein said trench has a square circumference.

4. The EEPROM cell of claim 1, wherein said trench has a circular circumference.

5. The EEPROM cell of claim 1, wherein said trench has a polygonal circumference.

6. The EEPROM cell of claim 2, wherein the thickness of said gate dielectric covering said third sidewall portion is substantially equal to the thickness of said gate dielectric covering said first sidewall portion.

7. An electrically erasable and programmable read only memory cell (EEPROM), comprising:

a first semiconductor layer of a first conductivity type;

a second semiconductor layer of said first conductivity type disposed on said first layer and having a lower doping level than that of said first layer, said first and second layers together forming a source region of said EEPROM cell;

a third semiconductor layer of a second conductivity type opposite that of said first type disposed on said second layer and extending to a surface of said EEPROM cell;

a fourth surface-adjoining semiconductor layer of said first conductivity type provided locally in said third layer and forming a drain region of said EEPROM cell;

a trench extending through said third and fourth layers and partially into said second layer, said trench having a floor and first, second, third and fourth sidewall portions;

a channel region located in a portion of said third layer adjacent a sidewall portion of said trench and extending from said second region to said fourth region;

a gate dielectric covering each of said sidewalls and said floor of said trench, a portion of said gate dielectric covering only said first and said third sidewall portions having a thickness which decreases along said first and third sidewall portions towards said floor;

a floating gate on said gate dielectric and extending adjacent the sidewall and floor of said trench;

an intergate dielectric covering at least an inner sidewall and floor of said floating gate; and a control gate disposed on said intergate dielectric and separated from said channel region by said floating gate.

8. The EEPROM cell of claim 7, wherein said trench has a square circumference.

9. The EEPROM cell of claim 7, wherein said trench has a circular circumference.

10. The EEPROM cell of claim 7, wherein said trench has a polygonal circumference.

* * * * *